United States Patent [19]
Ernst

[11] 4,168,462
[45] Sep. 18, 1979

[54] INDIRECT DETECTION OF MAGNETIC RESONANCE BY HETERONUCLEAR TWO-DIMENSIONAL SPECTROSCOPY

[75] Inventor: Richard R. Ernst, Winterthur, Switzerland

[73] Assignee: Varian Associates, Inc., Palo Alto, Calif.

[21] Appl. No.: 912,787

[22] Filed: Jun. 5, 1978

Related U.S. Application Data

[63] Continuation of Ser. No. 843,903, Oct. 20, 1977, abandoned.

[51] Int. Cl.$^2$ ............................................. G01R 33/08
[52] U.S. Cl. ............................ 324/0.5 AC; 324/0.5 R
[58] Field of Search ............ 324/0.5 R, 0.5 A, 0.5 AC

[56] References Cited
U.S. PATENT DOCUMENTS

| | | | |
|---|---|---|---|
| 2,887,673 | 5/1959 | Hahn | 324/0.5 R |
| 3,824,452 | 7/1974 | Freeman | 324/0.5 AC |
| 3,909,705 | 9/1975 | Tschopp | 324/0.5 AC |
| 4,068,161 | 1/1978 | Ernst | 324/0.5 R |

*Primary Examiner*—M. Tokar
*Attorney, Agent, or Firm*—Stanley Z. Cole; Edward H. Berkowitz

[57] ABSTRACT

A method is disclosed for highly sensitive indirect detection of nuclear magnetic resonance of nuclei having a low gyromagnetic ratio using pulse techniques. The method employs a coherent transfer of transverse magnetization from the nuclei of interest to nuclei of high gyromagnetic ratio for which the free induction decay, $S(t_2)$, is observed as a function of the length of the time interval, $t_1$, between imposition of transverse magnetization upon the nuclei of interest and transfer of magnetization to the observed nuclei. Contribution to the observed resonances not arising from the transferred transverse magnetization is eliminated and the resulting function $S(t_1, t_2)$ is double Fourier transformed to the frequency domain and displayed as a two dimensional plot for resolving the multiplet spectral structure of the spectra of the nuclei having such low gyromagnetic ratio.

9 Claims, 4 Drawing Figures

INDIRECT DETECTION OF MAGNETIC RESONANCE BY HETERONUCLEAR TWO-DIMENSIONAL SPECTROSCOPY

This is a continuation of application Ser. No. 843,903 filed 10/20/77 and now abandoned.

BACKGROUND OF THE INVENTION

The present invention relates in general to gyromagnetic resonance spectroscopy and particularly to an improvement in the method of such spectroscopy wherein the multiplet structure of coupled gyromagnetic resonators is resolved.

DESCRIPTION OF THE PRIOR ART

Techniques for the indirect detection of resonance have been utilized in many fields of magnetic resonance spectroscopy to enhance sensitivity and to investigate the structure and dynamics of spin systems. Indirect measurements rely upon the interaction of the magnetic moments of the system to be investigated (hereinafter S) with that of a known system (hereinafter I). Indirect methods are well suited to measurements wherein the signal to be investigated by direct methods would be exceedingly weak in relation to another set of resonators coupled therewith, the latter yielding a relatively strong signal.

In the prior art it was known to employ indirect detection by transfer of longitudinal magnetization between the subsystem of gyromagnetic resonators, S, to be investigated indirectly and the subsystem, I, whose resonances were observed. This transfer proceeds through cross-relaxation mechanisms which couple the two subsystems and permit an incoherent transfer of energy therebetween. It can be utilized in the laboratory or in the rotating frame of reference. The energy transfer requires a finite time interval, determined by the relevant relaxation parameters governing the cross-relaxation effects. An example of such an approach is that of detection of nuclear magnetic resonance through observation of electron spin resonance transitions, commonly referred to as ENDOR.

In the prior art it was also known to achieve indirect detection through frequency-dependent perturbation of the Hamiltonian by double resonance techniques. The spectrum of the observed subsystem I is modified by the application of a coherent irradiation to the subsystem S, coupled to subsystem I. The frequency dependence of this effect permits an indirect point-by-point measurement of the spectrum of the subsystem S by observing the resonances of the subsystem I. This mechanism requires a coherent coupling between the two subsystems leading to a resolved fine structure in the observed spectrum. Examples of this approach are the methods of spin tickling and INDOR.

It is also known to employ two dimensional pulsed NMR spectroscopy for the resolution of multiplet spectral structure produced by heteronuclear coupling. One such method and apparatus are described in U.S. Pat. No. 4,045,723. In this prior art, direct observation of the free induction decay of the resonators of interest (for example, $C^{13}$) is facilitated by application of a decoupling RF magnetic field pulse to another group of resonators (for example protons) coupled to the resonators of interest to decouple these resonators during the free induction decay of the $C^{13}$. The duration of the decoupling field pulse is varied and the detected resonance data, parameterized by the decoupling time is then double Fourier transformed to the frequency domain for display as a contour plot.

SUMMARY OF THE PRESENT INVENTION

The principal object of the present invention is the achievement of high sensitivity detection for indirectly observed gyromagnetic resonances of heteronuclear systems.

In one feature of the invention, a transverse magnetization is induced in a first group of gyromagnetic resonators. The transverse magnetization of the first group of gyromagnetic resonators is transferred after a time interval $t_1$ to a second group of gyromagnetic resonators coupled to said first group. The duration of the time interval $t_1$ is changed in successive transient resonances and the free induction decay of the second group is detected by sampling said signal at a plurality of sampling times, $t_2$. The data $S(t_1, t_2)$ from successive free induction decays is analysed as a function of successive values for the duration of the intervals t to derive gyromagnetic resonance data of said first group of resonators.

In another feature of the present invention, any persistent magnetization of said second group of resonators is removed and after a period $t_1$ a transverse magnetization is directly imposed upon the second group of gyromagnetic resonators and the free induction decay resonances of the second group of gyromagnetic resonators is obtained in the form $S_B(t_1, t_2)$ and subtracted from the equivalent data $S_A(t_1, t_2)$, obtained by transfer of transverse magnetization, to suppress the contribution of direct transverse magnetization to the transferred magnetization data $S_A(t_1, t_2)$.

In another feature of the present invention the detected gyromagnetic resonance difference data is transformed by two dimensional Fourier transformation from the time domain into the frequency domain to obtain two dimensional spectral data.

In another feature of the present invention the two dimensional spectral data is displayed in a two dimensional plot, whereby the multiplet structures of the spectra are resolved visually by inspection of the display.

In another feature of the present invention resonances of said second gyromagnetic resonators are saturated initially by means for example of a random pulse sequence to destroy initial magnetization thereof and to enhance polarization of the first group of resonators.

Other features and advantages of the present invention will become apparent a upon perusal of the following specification taken in connection with the accompanying drawings wherein:

DESCRIPTION OF THE PREFERRED EMBODIMENT

Figure 1:
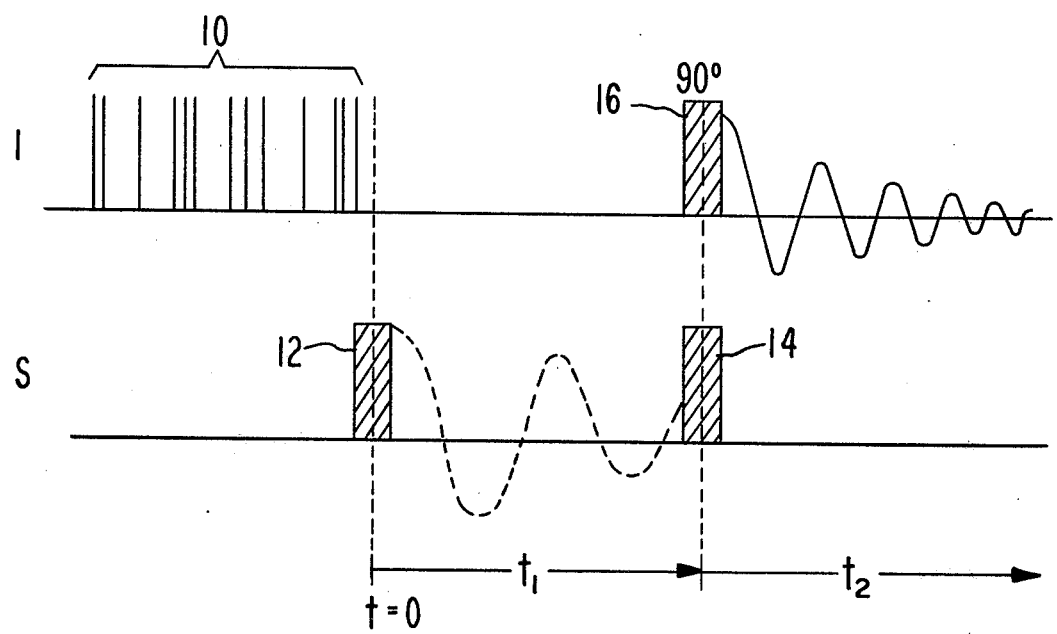
FIG. 1 is the basic pulse sequence for two dimensional heteronuclear spectroscopy.

The basic method as illustrated in FIG. 1. A saturating radio frequency irradiation 10 is first applied to destroy the magnetization of the spin subsystem I. This irradiation may be a pulse sequence may comprise randomly distributed pulse as before, intervals, widths, phases or intensities. At the same time, the S spin magnetization is enhanced by an internuclear Overhauser effect. At the time t=0, transverse S spin magnetization is created by means of a 90° pulse 12. After evolution for a time $t_1$, the transverse magnetization is transferred to the I spin subsystem by concurrent 90° pulses 14 and 16 applied respectively to the I and S spin subsystems. The precessing I spin magnetization is then measured as a function of $t_2$ for various evolution times $t_1$, thereby defining a data matrix $S(t_1, t_2)$. A two dimensional Fourier transformation leads then to the desired two dimensional spectrum $S(W_1, W_2)$ which contains the desired information about the S spin spectrum.

Although initial I spin magnetization is suppressed by a presaturation period using pseudo-random pulse sequence 10, during the evolution periods $0<t<t_1$, some recovery of the I subsystem magnetization will take place. On application of the subsequent 90° I spin pulse 16 transverse magnetization may be produced in the I spin system which is stronger than the weak magnetization transferred from the S spin. This directly imposed magnetization will produce peaks on the line $\omega_1=0$ in the two dimensional spectrum. In order to reduce problems concerned with the large dynamic range required to represent the free induction decay and to perform the subsequent Fourier transformation it is necessary to compensate for the unwanted magnetization. This is achieved by performing a second measurement for each value of $t_1$, identical to the original measurement but without any S spin pulses 12 and 14. Subtraction of this response then eliminates the signals arising from the unwanted I spin direct magnetization.

In another embodiment, the background suppression measurement utilizes both spin pulses but one of the two S spin pulses 12 or 14 is shifted by 180°. This has the effect of inverting the I spin magnetization which originates from the S spins, whereas the undesired directly produced I spin magnetization remains unchanged. Upon subtraction, the undesired I spin magnetization is eliminated while the signals arising from the S spin system add without any loss in sensitivity. The phase shifted 90° pulse can conveniently be replaced by an equivalent 270° pulse (sequence of three 90° pulses) if so desired.

It should be noted that there is no net transfer of magnetization from the S to the I spins and that the total signal integral is 0. It is therefore often convenient to plot absolute value spectra.

Figure 2:
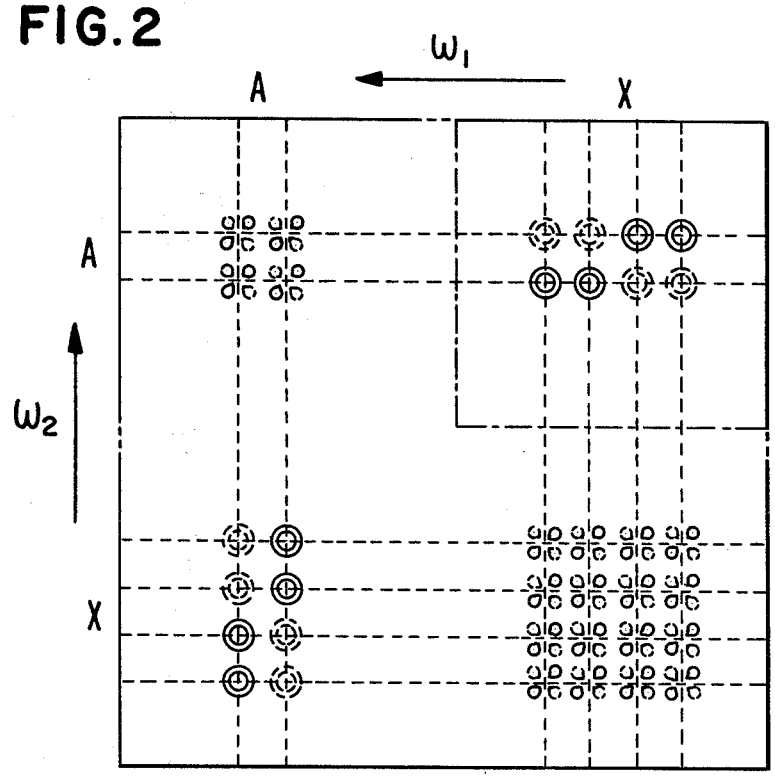
FIG. 2 illustrates the relationship to two dimensional auto-correlated spectroscopy of an $A_3X$ spin system.

A schematic $A_3X$ auto-correlated two dimensional spectrum is shown in FIG. 2. By observation of transitions of the A subsystem during the detection period, it is possible to deduce indirectly all spin resonances. All relevant information is contained in the upper right off-diagonal block of FIG. 2. Considering A as I spins and X as the S spin, this off-diagonal block is equivalent to a heternuclear two dimensional spectrum obtained by the technique above described. Signals taken along the axis of $\omega_1$ describe the S spin resonance frequencies and signals along the axis $\omega_2$ describe the I spin resonance frequencies. It is apparent that only that part of the S spin system which is coupled to I spins, contributes to the resulting spectrum. The frequency origin for the two axes are given by the carrier frequencies of the S and I spin pulses, respectively.

The significant modification to the auto-correlated two dimensional experiments of the prior art, here modified for indirect detection, is a simultaneous application of two mixing pulses 14 and 16, whose frequencies are neither phase coherent nor in any respect related. It can be shown that the absolute phase of the two S spin 90° pulses has no effect on the transferred magnetization so long as the two pulses have a fixed phase relationship. However, phase-shifting only one of the two S spin pulses by $\phi$ will phase-shift by the same amount that portion of the signal which originates from the original S spin magnetization but will leave invariant the signal originating from the remaining I spin magnetization.

The described technique has been employed to indirectly detect $C^{13}$ spectra through observation of coupled proton resonances. Experiments have been carried out on a Varian DA 60 spectrometer with an internal flourine field-frequency lock modified for pulsed operation. The additional C transmitter channel consists of a frequency synthesizer, a 4.5 watt power amplifier and a separate saddle-shaped transmitter coil which was wound around the existing Varian probe insert and tuned to 15 MHz.

Figure 3:
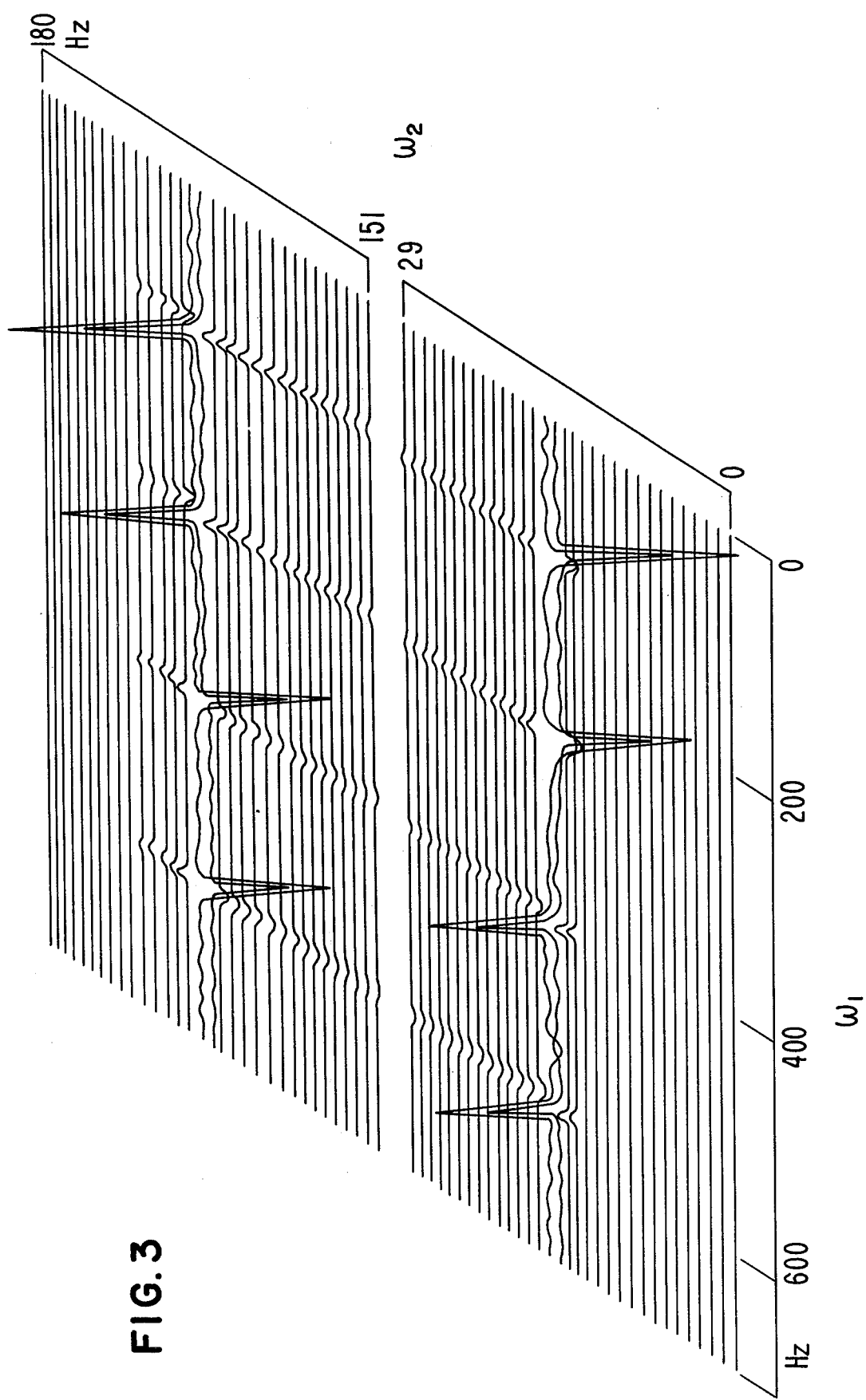
FIG. 3 is a two dimensional phase-sensitive spectrum of C-enriched methyl iodide.

An example of a phased-sensitive two dimensional heternuclear spectrum of 90 percent carbon-13 enriched methyl iodide is shown in FIG. 3A. The $\omega_1$ axis corresponds to the carbon-13 and the $\omega_2$ axis to the proton frequencies. Each peak within the spectrum corresponds to a connected transition between the carbon and the proton spin systems. To enhance the digital resolution in the $W_2$ direction and to economize on computer memory and computation time, two frequency regions centered at the two proton frequencies have been selected after the first Fourier transformation. It is evident that the total signal integral over the two dimensional spectrum is 0, and it can easily be deduced from the energy level diagram that the negative peaks correspond to regressive transitions and the positive peaks to progressive transitions. Projection of the absolute value spectrum onto the $\omega_1$ axis would produce a carbon-13 spectrum with the proper frequencies but, instead of the expected 1, 3, 3, 1 quartet, a spectrum with all equal intensities is observed in agreement with theoretical calculations of the two dimensional signal intensities in an $A_3X$ system.

Figure 4:
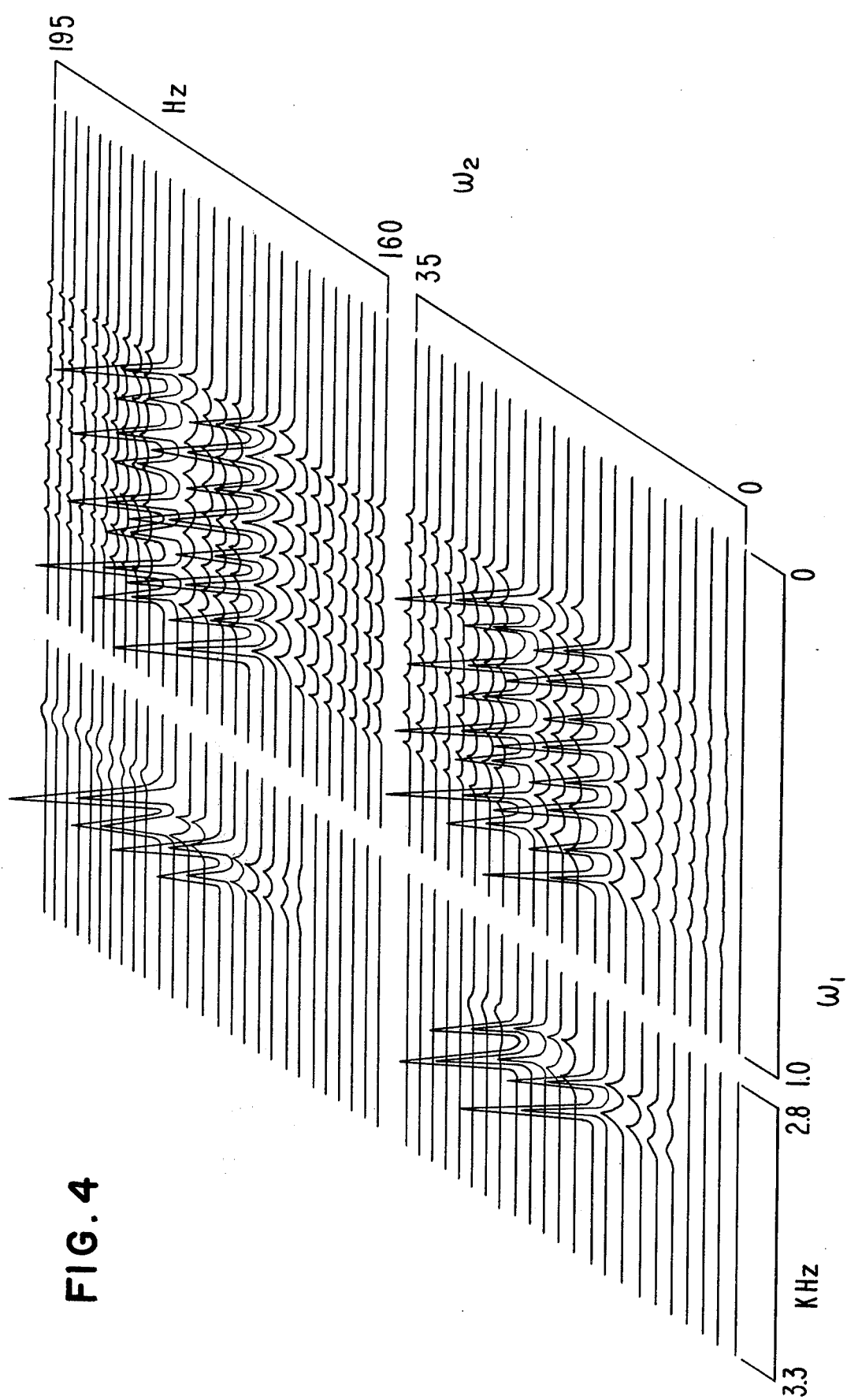
FIG. 4 is a two dimensional heteronuclear absolute value spectrum of doubly C-enriched acetic acid.

FIG. 4 shows an absolute value spectrum of 90 percent doubly carbon-13 labeled acetic acid. Again, frequency selection along $\omega_2$ has been utilized similar to the procedure outline above. The two frequency regions in the $\omega_2$ direction contain the four methyl proton lines, selected after the first Fourier transformation. Additionally, to increase the digital resolution for the wide carbon-13 spectrum, frequency folding has been used in the domain at the origin and at the Nyquist frequency. Residual direct proton magnetization has been suppressed by the method discussed above. The acidic proton is not observed as it does not carry information on the carbon-13 systems. This two dimensional spectrum contains all resonance frequencies of the proton coupled carbon-13 spectrum, although due to the limited number of sampling points in $t_1$, the multiplet of the acetic carbon is not completely resolved. The observed intensities do not correspond to the theoretically predicted equality of intensities. These anomalies are most likely due to relaxation effects and to insufficient field strength for the carbon-13 RF pulses.

In addition to the peaks of doubly labelled acetic acid, eight weaker peaks of $^{13}CH_3^{12}COOH$ are visible within the line group on the left hand side of FIG. 4. The corresponding lines of $^{12}CH_3^{13}COOH$ would be found in the suppressed central region of the spectrum.

CONCLUSIONS

The method of the present invention can be regarded as an alternative to INDOR for the indirect detection of resonance. The present method has the advantage of considerably increased sensitivity because it is a Fourier technique with simultaneous detection of all resonances, whereas by contrast INDOR requires a point-by-point measurement. The sensitivity which may be achieved for indirectly detected carbon-13 resonance by the method of the present invention is almost an order of magnitude greater than can be obtained from a direct Fourier detection scheme due to the larger gyromagnetic ratio of the observed protons.

Moreover, the present method permits determination of additional information concerning the connectivity of the transitions and the cross relaxation mechanisms characterizing the coupling interactions. By the present method it is possible, for example, to uniquely assign the resonances of indirectly bonded carbon nuclei and protons.

Numerous variations on the above-described method will occur to one skilled in the art. For example, technique is by no means restricted to the detection of low sensitivity nuclei and may be used for the elucidation of heteronuclear spin systems in general. The step of compensating for directly induced transverse magnetization may be performed in the frequency domain instead of the time domain. In lieu of recording a full two dimensional spectrum, projections or summations may be employed to select, record and display one dimensional spectra of particular interest.

Since many changes could be made in the above method and many apparently different embodiments of this invention could be made without departing from the scope thereof, it is intended that a matter contained in the above description or shown in the accompanying drawing shall be interpreted as illustrative and not in a limiting sense.

What is claimed is:

1. In a method of gyromagnetic resonance spectroscopy the steps of
    inducing a plurality of transient gyromagnetic resonances of a first group of gyromagnetic resonators coupled to a second group of gyromagnetic resonators within a sample of matter to be analyzed;
    permitting each said transient resonance to evolve for an interval of time;
    transferring said resonances of said first group of resonators to said second group of resonators;
    changing the duration of said interval for each transient resonance of said plurality,
    detecting and recording the transferred plurality of said resonances of said second group of resonators, as a function of the changing duration of said interval,
    directly inducing a plurality of gyromagnetic resonances of said second group of gyromagnetic resonators,
    permitting each said transient resonance to evolve for a period of time, said period of time corresponding to said interval of time,
    detecting the directly induced plurality of said resonances of said second group of resonators, as a function of said changing periods of time, and
    combining said detected transferred plurality of resonances of said second group of resonators with said detected directly induced resonances of said second group of resonators to suppress a directly induced component in said detected transferred resonances.

2. The method of claim 1 wherein said steps of combining includes the step of subtracting the detected directly induced resonance of said second group of resonators from said transferred resonance of said second group of resonators.

3. The method of claim 2 including the step of destroying any persistent magnetization of said second group of gyromagnetic resonators prior to said step of inducing resonances of a first group of gyromagnetic resonators.

4. The method of claim 3 including the step of double Fourier transforming said subtracted gyromagnetic resonance data from the time domain into the frequency domain to obtain Fourier transformed gyromagnetic resonance spectral data from which to derive two-dimensional spectral data.

5. The method of claim 4 including the step of forming a two-dimensional spectral display of said Fourier transformed frequency domain spectral data for spacially separating multiplet spectral structures associated with said first group of resonators.

6. The method of claim 1 wherein said step of inducing a plurality of gyromagnetic resonances in said first group of resonators is accomplished by applying a first pulse to said first group of resonators and said step of transferring resonances of said first group of resonators to said second group of resonators is accomplished by applying a second pulse to said first groups of resonators and a substantially concurrent 90° pulse to said second group of resonators.

7. The method of claim 6 wherein said first and said second pulses are both 90° pulses.

8. The method of claim 6 wherein both said first and second pulses are 90° pulses and one of said first and second pulses is phase shifted 180° with respect to the other 90° pulse.

9. The method of claim 8 wherein said 180° phase shifted pulse is realized from a succession of three 90° pulses.

* * * * *